United States Patent [19]

Fujioka et al.

[11] Patent Number: 4,526,838
[45] Date of Patent: Jul. 2, 1985

[54] POLYAMINO-BIS-IMIDE RESIN

[75] Inventors: Atsushi Fujioka; Yasuo Miyadera; Tomio Fukuda, all of Shimodate, Japan

[73] Assignee: Hitachi Chemical Company, Ltd., Tokyo, Japan

[21] Appl. No.: 529,554

[22] Filed: Sep. 6, 1983

[30] Foreign Application Priority Data

Sep. 8, 1982 [JP] Japan ................. 57-156046

[51] Int. Cl.³ .............. C08G 73/10; C08G 73/12
[52] U.S. Cl. ............................ 428/458; 428/473.5;
524/36; 524/376; 524/378; 524/600; 524/602;
524/606; 528/125; 528/128; 528/170; 528/172;
528/228; 528/229; 528/321; 528/322
[58] Field of Search .............. 528/125, 128, 170, 172,
528/228, 229, 321, 322; 524/36, 376, 378, 600,
602, 606; 428/458, 473.5

[56] References Cited

U.S. PATENT DOCUMENTS

| Re. 29,316 | 7/1977 | Bargain et al. | 528/170 |
|---|---|---|---|
| 3,671,490 | 6/1972 | Bargain et al. | 528/170 |
| 3,767,626 | 10/1973 | Laurent et al. | 528/170 |
| 4,064,192 | 12/1977 | Bargain | 528/170 |
| 4,116,937 | 9/1978 | Jones et al. | 528/229 |
| 4,283,522 | 8/1981 | Takahashi et al. | 528/125 |
| 4,299,946 | 11/1981 | Balme et al. | 528/128 |
| 4,346,206 | 8/1982 | Takahashi | 528/88 |
| 4,435,560 | 3/1984 | Takahashi et al. | 528/170 |

FOREIGN PATENT DOCUMENTS

| 0047530 | 3/1982 | European Pat. Off. | 528/170 |
|---|---|---|---|
| 40462 | 3/1982 | Japan | 528/170 |
| 49621 | 3/1982 | Japan | 528/170 |

Primary Examiner—Lester L. Lee
Attorney, Agent, or Firm—Gordon W. Hueschen

[57] ABSTRACT

A curable polyamino-bis-imide resin, obtained by the thermal reaction of:
(A) a bis-imide represented by the general formula I:

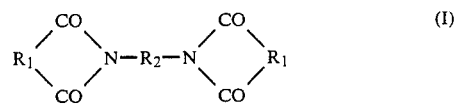

wherein $R_1$ stands for a divalent organic group having a carbon-carbon double bond and $R_2$ for a divalent aromatic organic group having 1 to 3 benzene rings, with
(B) a diamine represented by the general formula II:

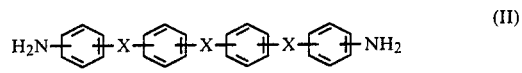

wherein X stands for one member selected from the group consisting of O, S, $SO_2$, $CH_2$, CO, COO, $C(CH_3)_2$, $CF_2$ and $C(CF_3)_2$, providing that the three X's may be identical or not identical to one another and the hydrogen atoms attached to the benzene rings may be substituted by an inactive alkyl group, perfluoroalkyl group or halogen atom, a solution thereof, cross-linked resins therefrom and laminated boards therefrom.

12 Claims, 1 Drawing Figure

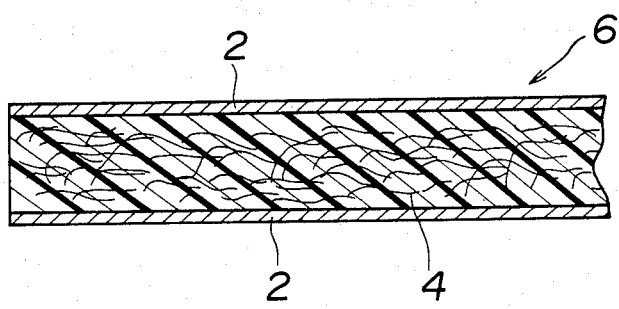

POLYAMINO-BIS-IMIDE RESIN

BACKGROUND OF THE INVENTION

1. Field of the Invention

This invention relates to a polyamino-bis-imide resin, solutions thereof, cross-linked resins derived therefrom and laminated boards therefrom. More particularly, this invention relates to a polyamino-bis-imide resin which dissolves in ordinary organic solvents of low boiling points and, on curing, acquires outstanding thermal resistance, solutions thereof, cross-linked resins derived therefrom and laminated boards therefrom.

2. Description of Prior Art

Heretofore, polyamino-bis-maleimide resins such as, for example, a polyimide resin formed of N,N'-4,4'-diphenylmethane-bis-maleimide and 4,4'-diaminodiphenylmethane have found acceptance in the production of heat resistant adhesives and heat resistant laminates which are required to exhibit thermal resistance, dimensional stability, electric properties, etc. all at high levels (U.S. Pat. No. Re. 29,316). These polyamino-bis-maleimide resins, however, have the disadvantage that they are soluble only in special high-boiling point solvents such as, for example, expensive N-methyl-2-pyrrolidone (202° C. of boiling point) and N,N-dimethylformamide (153° C. of boiling point). Use of such a special high-boiling point solvent has proved undesirable because the solvent has adverse effects on work environment and also because it remains in a high concentration in the shaped article formed of the resin. Particularly when this special high-boiling point solvent is used in the production of heat resistant laminated board, in the course of application of a prepared resin solution, varnish exudes from the prepreg and the solvent persists in the laminated board, possibly with the result that adverse affects will be brought about on properties such as boiling water absorption and resistance to measling.

As a solution of this problem, there has been proposed an imide type prepolymer produced by the reaction of an epoxy resin soluble in ordinary low-boiling point organic solvents with a bisimide and a diamine (U.S. Pat. No. 4,346,206). This imide type prepolymer, however, has the disadvantage that it exhibits a lower glass transition point than a polyamino-bis-imide resin formed of a bisimide and a diamine because it incorporates the epoxy compound.

An object of this invention, therefore, is to provide a novel polyamino-bis-imide resin and cross-linked resins derived therefrom.

Another object of this invention is to provide a polyamino-bis-imide resin which dissolves in ordinary low-boiling point organic solvents and, on curing, acquires outstanding thermal resistance and to cross-linked resins derived therefrom.

SUMMARY OF THE INVENTION

These objects are attained by the present invention in a curable polyamino-bis-imide resin obtained by the thermal reaction of (A) a bis-imide represented by the general formula I:

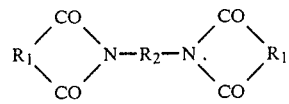

wherein $R_1$ stands for a divalent orgnaic group having a carbon-carbon double bond and $R_2$ for a divalent aromatic organic group having 1 to 3 benzene rings with (B) a diamine represented by the general formula II:

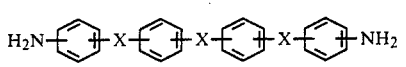

wherein X stands for one member selected from the group consisting of O, S, $SO_2$, $CH_2$, CO, COO, $C(CH_3)_2$, $CF_2$ and $C(CF_3)_2$, providing that the three X's may be identical or not identical to one another and the hydrogen atoms attached to the benzene rings may be substituted by an inactive alkyl group, perfluoroalkyl group or halogen atom. The objects mentioned above are also attained by this invention in the solution of the aforementioned curable polyamino-bis-imide resin in a low-boiling point organic solvent.

These objects are also attained by the present invention in a cross-linked resin obtained by curing the aforementioned curable polyamino-bis-imide resin.

These objects are further attained by the present invention in a copper clad laminating board obtained by bonding a copper foil to fiber-reinforced polyamino-bis-imide resin.

BRIEF DESCRIPTION OF THE DRAWING

The drawing attached hereto represents a cross section illustrating a typical laminated board obtained in accordance with the present invention.

PREFERRED EMBODIMENT OF THE INVENTION

The aforementioned polyamino-bis-imide resin of the present invention is obtained by the thermal reaction of (A) a bis-imide represented by the general formula I:

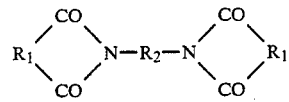

wherein $R_1$ stands for a divalent organic group having a carbon-carbon double bond and $R_2$ for a divalent aromatic organic group having 1 to 3 benzene rings with (B) a diamine represented by the general formula II:

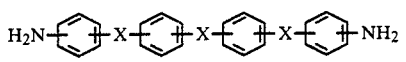

wherein X stands for one member selected from the group consisting of O, S, $SO_2$, $CH_2$, CO, COO, $C(CH_3)_2$, $CF_2$ and $C(CF_3)_2$, providing that the three X's may be identical or not identical to one another and the hydrogen atoms attached to the benzene rings may be substituted by an inactive alkyl group, perfluoroalkyl group or halogen atom.

The reaction of the bis-imide (A) with the diamine (B) proceeds with addition of the —$NH_2$ group of the diamine (B) to the carbon-carbon double bond of the bis-imide (A) and consequent formation of a

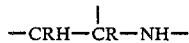

bond (wherein R stands for a substituent in the possession of the relevant carbon atom) and, thus, produces a linearly polymerized polyamino-bis-imide resin. The polyamino-bis-imide resin which is produced by this method is soluble in any ordinary low-boiling point organic solvent and the resin dissolved in this solvent, on curing, acquires outstanding thermal property.

The bis-imides (A) which are usable for the purpose of this invention are represented by the aforementioned general formula I. In this general formula, $R_1$ stands for a divalent organic group having a carbon-carbon double bond. Typical examples of this divalent organic group are —CH=CH—,

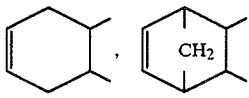

and derivatives resulting from the substitution of hydrogen atoms in these organic groups by an alkyl group or a halogen atom. $R_2$ stands for a divalent aromatic organic group having 1 to 3 benzene rings. This divalent aromatic organic group is selected from the group consisting of

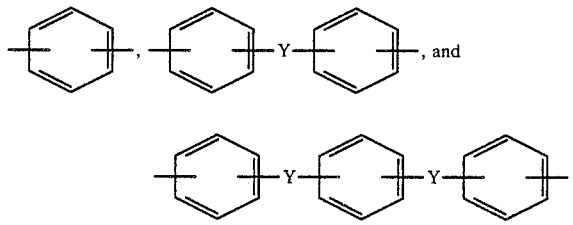

wherein Y stands for one member selected from the group consisting of O, S, $SO_2$, $CH_2$, CO, COO, $C(CH_3)_2$, $CF_2$ and $C(CF_3)_2$, providing that the two Y's may be identical or not identical with each other and the hydrogen atoms attached to the benzene rings may be substituted by an inactive group such as, for example, an alkyl group, a perfluoroalkyl group or a halogen atom.

Examples of unsaturated bis-imides are N,N'-m-phenylene-bis-maleimide, N,N'-p-phenylene-bis-maleimide, N,N'-4,4'-diphenylether-bis-maleimide, N,N'-4,4'-diphenylthioether-bis-maleimide, N,N'-4,4'-diphenylsulfon-bis-maleimide, N,N'-4,4'-diphenylmethane-bis-maleimide, N,N'-4,4'-diphenylpropane-bis-maleimide, N,N'-[4,4'-diphenoxy-1,4-benzene]-bis-maleimide, N,N'-4,4'-diphenylmethane-bis-tetrahydrophthalmide and N,N'-4,4'-diphenylpropane-bis-endomethylenetetrahydrophthalmide.

The diamines (B) which are usable for the purpose of this invention are represented by the general formula II. Examples of these diamines are 4,4'-di-(p-aminophenoxy)-diphenyl sulfone, 4,4'-di-(m-aminophenoxy)-diphenyl sulfone, 4,4'-di-(p-aminophenoxy)-diphenyl ether, 4,4'-di-(m-aminophenoxy)-diphenyl ether, 4,4'-di-(p-aminophenoxy)-diphenylmethane, 4,4'-di-(m-aminophenoxy)-diphenylmethane, 4,4'-di-(p-aminophenoxy)-diphenylpropane, 4,4'-di-(m-aminophenoxy)-diphenylpropane, 4,4'-di-(p-aminophenylsulfonyl)-diphenyl ether, 4,4'-di-(m-aminophenylsulfonyl)-diphenyl ether, 4,4'-di-(p-aminophenylthioether)-diphenylsulfide, 4,4'-di-(m-aminophenylthioether)-diphenylsulfide, 4,4'-di-(p-aminobenzoyl)-diphenyl ether, 4,4'-di-(p-aminophenoxy)-diphenyldifluoromethane and 4,4'-di-(p-aminophenoxy)-diphenyl hexafluoropropane. Two or more of these diamines may be used in a combined state without inducing any detriment. Any of the diamines (B) mentioned above may be used in combination with any known diamine having one to three benzene rings without involving any detriment.

As a counterpart of the present invention, Japanese Unexamined Patent Application Disclosure No. SHO 57(1982)-40462 has disclosed a combination of N,N'-4,4'-di-(p-aminophenoxy)-diphenylpropane-bis-endomethylenetetrahydrophthalimide (a bis-imide having four benzene rings in the portion corresponding to $R_2$) with N,N'-4,4'-di-(p-aminophenoxy)-diphenyl propane. Because of the large number of benzene rings, however, the combination has a low glass transition point and suffers from a serious economic problem.

The mixing molar ratio of a bis-imide (A) to a diamine (B) is in the range of 1:0.1 to 1:1, preferably 1:0.25 to 1:0.8. If the amount of the diamine (B) to be mixed with 1 mole of the bis-imide (A) is less than 0.1 mole, the solubility of the resin which characterizes this invention tends to be insufficient. If the amount of the diamine (B) to be mixed with 1 mole of the bis-imide (A) exceeds 1 mole, the molecule lacks the double bond at its terminal and, therefore, is incapable of cross-linking. The temperature of the reaction of the bis-imide (A) with the diamine (B) is in the range of 100° to 200° C., preferably 120° to 150° C. If the temperature is below 100° C., then the reaction does not proceed smoothly. If the temperature exceeds 200° C., the reaction has a possibility of inducing the phenomenon of gelation. The duration of the reaction of the bis-imide (A) with the diamine (B) is variable with the reactivity of the particular reactants involved in the reaction. If this duration is too short, then a large portion of the bis-imide (A) remains unaltered and the resultant resin, therefore, exhibits insufficient solubility. If the duration is too long, the polymerization proceeds excessively and the resin tends to acquire insufficient solubility. The duration of this reaction, therefore, is generally in the range of 5 to 480 minutes, preferably 10 to 120 minutes.

The reaction of the bis-imide (A) with the diamine (B) can be carried out in the absence of a solvent when the reactants are heated at a temperature exceeding the melting point of either of the two reactants. It may be thermally carried out in an organic solvent whose boiling point (under 760 mmHg) is in the range of 100° to 170° C., preferably 120° to 150° C. Examples of the organic solvent satisfying this condition are 2-methoxyethanol, 2-ethoxyethanol, 2-(methoxymethoxy)-ethanol and 2-isopropoxy-ethanol. When the reaction is carried out in any of the desirable organic solvents enumerated above, the polyamino-bis-imide resin produced by this reaction in the reaction mixture may be precipitated therein by adding a poor solvent for the polyamino-bis-imide resin such as, for example, water or methanol in a large excess to the reaction mixture. Then, the polyamino-bis-imide resin can be obtained in a solid state by separating the precipitate by filtration and drying the separated precipitate. Also the reaction mixture may be used as a solution without precipitating the solid resin.

The polyamino-bis-imide resin of this invention which is produced as described above readily dissolves at room temperature in a low boiling point organic solvent such as, for example, methylethyl ketone (80° C. of boiling point), 2-methoxyethanol (124° C. of boiling point) or 2-ethoxyethanol (135° C. of boiling point). The polyamino-bis-imide resin, therefore, can be used favorably in the form of a solution obtained by dissolving the resin in a concentration of 20 to 70% by weight, preferably 40 to 60% by weight, in an organic solvent having a boiling point in the range of 70° to 160° C., preferably 80° to 140° C., for the production of laminated boards, for example. The conventional polyamino-bis-imide resin dissolves only in such a special and expensive high-boiling point solvent as N-methyl-2-pyrrolidone (202° C. of boiling point). The solvent contained in he produced resin, therefore, cannot be amply expelled from the resin during the treatment for the removal of the solvent by application of heat. By contrast, since the polyamino-bis-imide resin of the present invention can be dissolved in an inexpensive ordinary low boiling point solvent, the removal of the solvent contained in the resin by application of heat can be easily accomplished. Thus, the solvent persisting in the shaped article formed of this resin can be decreased to a great extent.

The curable polyamino-bis-imide resin obtained in accordance with this invention can be converted into a thermally stable cross-linked resin by being subjected to thermosetting at a temperature of 170° to 300° C., preferably 180° to 220° C., for a period of 0.5 to 48 hours, preferably 1 to 4 hours. In this thermosetting reaction, a radical reaction initiator may be used as a catalyst. Examples of the radical reaction initiator usable advantageously in this reaction are organic peroxide such as tert-butyl peroxypropylcarbonate, dicumyl peroxide, tert-butyl peroxyacetate, tert-butyl peroxybenzoate and di-tert-butyl peroxide and tert-butyl cumyl peroxide.

The curable polyamino-bis-imide resin or the solution thereof in an organic solvent permits incorporation therein of such reinforcing fibers as glass fibers and carbon fibers and such fillers as fused silica, calcium carbonate, for example.

The curable polyamino-bis-imide resin can be molded in any desired shape such as a board by the compression molding method, the transfer molding method, the injection molding method, etc. A copper clad laminated board 6 having a cross section as illustrated in the accompanying drawing is obtained by incorporating a reinforcing material such as, for example, glass cloth into this resin and superposing a layer of the reinforced resin 4 between copper foils 2 and 2. This copper clad laminated board 6 is highly useful as a substrate for varying circuits.

Now this invention will be described in detail below with reference to working examples. It should be noted that this invention is not limited to these examples.

EXAMPLE 1

The following synthesis was carried out by using an eggplant type flask provided with a condenser.

In 196.6 parts by weight of 2-methoxyethanol, 100 parts by weight of N,N'-4,4'-diphenylmethane-bis-maleimide

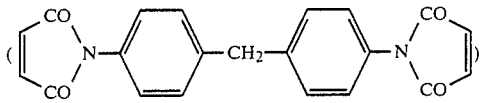

and 96.6 parts by weight of 4,4'-di-(p-aminophenoxy)-diphenyl sulfone

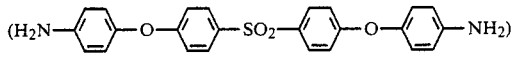

(1.0:0.8 of molar ratio of bisimide to diamine) were stirred at an oil bath temperature of 120° to 130° C. for 30 minutes to induce a thermal reaction and produce a polyamino-bis-imide resin. Then, the reaction solution was cooled to room temperature and the solution (50% by weight of concentration) was placed under observation for possible change in transparency due to occurrence of suspended matter. The solution, even at the end of seven days' standing, showed no sign of loss of transparency.

EXAMPLE 2

A polyamino-bis-imide resin was synthesized by following the procedure of Example 1, except that 4,4'-di-(m-aminophenoxy)-diphenyl sulfone

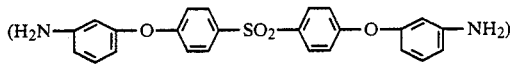

was used in the place of 4,4'-di-(p-aminophenoxy)-diphenyl sulfone. The solution resulting from the thermal reaction (50% by weight of concentration) was placed under observation for change in transparency due to occurrence of suspended matter. The solution, even at the end of seven days' standing, showed no sign of loss of transparency.

EXAMPLE 3–6

A polyamino-bis-imide resin was synthesized by following the procedure of Example 1, except that 4,4-di-(p-aminophenoxy)-diphenylpropane

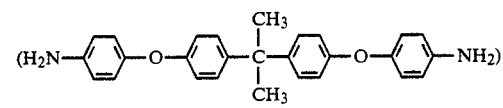

was used in a varying amount (parts by weight) indicated in Table 1 in the place of 4,4'-di-(p-aminophenoxy)-diphenyl sulfone and 2-methoxyethanol was used in an amount such that the resultant solution had a concentration of 50% by weight. None of the solutions thus obtained showed any sign of loss of transparency due to occurrence of suspended matter even at the end of seven days' standing.

To the solution of Example 3, methanol was added in a large excess to cause precipitation of polyamino-bis-imide resin in the solution. The precipitate was separated by filtration and dried under a vacuum to obtain a solid polyamino-bis-imide resin. This resin was tested for solubility in methylethyl ketone. Thus, it was found to be soluble in the solvent at room temperature.

The solid polyamino-bis-imide resin was molded in a metal die at 190° C. for one hour under application of pressure (40 kg f/cm², 3.9×10⁶N/m²) and further subjected to post-curing at 250° C. for 24 hours. The glass transition point (Tg) of the resultant cured resin was found from the point of bend in the curve of thermal expansion coefficient to be 302° C. It was thus shown to possess very high thermal resistance.

CONTROLS 1-4

A polyamino-bis-imide resin was synthesized by following the procedure of Example 1, except that 4,4-diaminodiphenylmethane

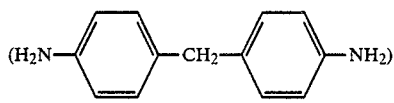

was used in a varying amount (parts by weight) indicated in Table 1 in the place of 4,4′-di-(p-aminophenoxy)-diphenyl sulfone and 2-methoxyethanol was used in an amount such that the resultant solution had a concentration of 50% by weight.

The solution of Control 1 became turbid after seven days' standing. The solutions of Controls 2-4 became turbid after one day's standing.

The polyamino-bis-imide resin of Control 1 was cured by following the procedure of Example 3 to afford a board of cured resin. This board was found by test to have a Tg of 325° C.

EXAMPLE 7

Forty (40) parts by weight of 4,4′-di-(p-aminophenoxy)-diphenylpropane (119° C. of melting point) was melted by heating at 150° C. and then stirred with 100 parts by weight of N,N′-4,4′-diphenylmethane-bis-imide (1:0.35 of molar ratio of bis-imide to diamine) at 150° C. for 10 minutes to induce a thermal reaction in the absence of a solvent. The reaction product was cooled to room temperature. The polyamino-bis-imide resin thus obtained was tested for solubility in 2-methoxyethanol. The solution having a concentration of 50% by weight showed no sign of loss of transparency due to occurrence of suspended matter even at the end of seven days' standing.

EXAMPLE 8

In 140 parts by weight of 2-methoxyethanol, 100 parts by weight of N,N′-4,4′-diphenylmethane-bis-maleimide and 40 parts by weight of 4,4′-di-(p-aminophenoxy)-diphenylpropane (1.0:0.35 of molar ratio of bisimide to diamine) were stirred at 120° C. to 130° C. for 30 minutes to induce a thermal reaction and produced a polyamino-bis-imide resin solution (50% by weight of concentration). The polyamino-bis-imide resin solution was impregnated into a glass cloth having 0.2 mm of thickness (G-9020-BY52, manufactured by Nitto Boseki Kabushiki Kaisha), and dried at a temperature of 170° C. for 3 minutes to obtain a prepreg. The prepreg thus obtained had no sagging of vanish.

Eight sheets of the prepreg were plied up, then two sheets of copper foil having 35 μm of thickness (FC-TAI-35, manufactured by Furukawa Circuit Foil Kabushiki Kaisha) were plied up at both sides, and then these were put between two mirror plates and pressed at a temperature of 200° C. for two hours under a pressure of 40 kgf/cm² (3.9×10⁶N/m²) to obtain a copper clad laminated board having 1.6 mm of thickness. Further, the copper plated laminated board was post-cured at a temperature of 200° C. for 5 hours.

Properties of the copper clad laminated board except last two properties were tested referring a method of Japanese Industrial Standard (JIS) C-6481. The results are shown in Table 2.

TABLE 5

| | |
|---|---|
| Solder float (300° C., 5 minutes float) | no blistering no delamination |
| Peel strength of copper foil | 1.6 kgf/cm (16 N/cm) |
| Insulation resistance (E-1/105) | 10¹³ Ω |
| Insulation resistance (E-1/105 + D-2/100) | 10¹¹ Ω |
| State after dipping into solder of 260° C. for 30 seconds after treating in a pressure cooker at 121° C. for 2 hours. | no blistering, no delamination |
| Tg (used TMA-1500) | 180° C. |

As described above, the polyamino-bis-imide resin produced according to the present invention is soluble in such inexpensive low-boiling point ordinary solvents as methylethyl ketone, 2-methoxyethanol, 2-ethoxyethanol and 2-isopropoxyethanol and the cured resin derived therefrom possesses outstanding thermal stability. Thus, these resins enjoy high commercial value.

TABLE 1

Solubility and thermal resistance of varying species of polyamino-bis-imide resin

| | Example 3 | Example 4 | Example 5 | Example 6 | Control 1 | Control 2 | Control 3 | Control 4 |
|---|---|---|---|---|---|---|---|---|
| Formulation | | | | | | | | |
| N,N′—4,4′-diphenylmethane-bis-maleimide | 100 | 100 | 100 | 100 | 100 | 100 | 100 | 100 |
| 4,4′-di-(p-aminophenoxy)-diphenylpropane | 40.2 | 57.2 | 74.4 | 91.6 | — | — | — | — |
| 4,4′-diaminodiphenyl(methane | — | — | — | — | 19.2 | 27.6 | 36.0 | 44.4 |
| Bis-imide:diamine (molar ratio) | 1:0.35 | 1:0.5 | 1:0.65 | 1:0.8 | 1:0.35 | 1:0.5 | 1:0.65 | 1:0.8 |
| Solubility of resin in 2-methoxyethanol | o | o | o | o | Δ | x | x | x |
| Thermal resistance: Tg (°C.) | 302 | — | — | — | 325 | — | — | — |

(1) Denomination of numerical values given in Formulation: Parts by weight
(2) Conditions for Tg test: Measured by thermo-mechanical analyser, TMA-1500, made by Shinkuriko Kabushiki Kaisha, with a temperature increase ratio of 5° C./min, under a load of 5 g.
(3) Solubility: o Completely soluble, Δ Precipitated after 7 days, x Precipitated after 1 day.

As described above, the copper clad laminated board is superior in heat resistance and does not occur measling even in soldering test after severe moisture treating.

What is claimed is:

1. A curable polyamino-bis-imide resin, obtained by the thermal reaction of:

(A) a bis-imide represented by the general formula I:

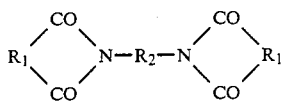

wherein $R_1$ stands for a divalent organic group having a carbon-carbon double bond and $R_2$ for a divalent aromatic organic group having 1 to 3 benzene rings, with (B) a diamine represented by the general formula II:

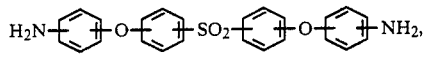

the mole ratio of said bis-imide (A) to said diamine (B) being in the range of 1:0.1 to 1:1.

2. A curable polyamino-bis-imide resin according to claim 1, wherein said bis-imide (A) is N,N'-4,4'-diphenylmethane-bis-maleimide.

3. A curable polyamino-bis-imide resin according to claim 2, wherein said diamine (B) is a 4,4'-di-(aminophenoxy)-diphenyl sulfone.

4. A curable polyamino-bis-imide resin according to claim 1, wherein the molar ratio of said bis-imide (A) to said diamine (B) is in the range of 1:0.25 to 1:0.8.

5. A curable polyamino-bis-imide resin according to claim 1, wherein said thermal reaction is carried out at a temperature in the range of from 100° to 200° C.

6. A curable polyamino-bis-imide resin according to claim 5, wherein said thermal reaction is carried out at a temperature in the range of from 120° to 150° C.

7. A curable polyamino-bis-imide resin according to claim 5, wherein said thermal reaction is carried out in an organic solvent selected from the group consisting of 2-methoxyethanol, 2-ethoxyethanol, 2-(methoxymethoxy)-ethanol and 2-isopropoxyethanol.

8. A polyamino-bis-imide resin solution, obtained by dissolving any of the curable polyamino-bis-imide resins set forth in claim 1 in an organic solvent having a boiling point in the range of from 70° to 160° C.

9. A polyamino-bis-imide resin solution according to claim 8, wherein said organic solvent is at least one member selected from the group consisting of methylethyl ketone, 2-methoxyethanol and 2-ethoxyethanol.

10. A cross-linked resin, obtained by thermosetting a polyamino-bis-imide resin obtained by the thermal reaction of:

(A) a bis-imide represented by the general formula I:

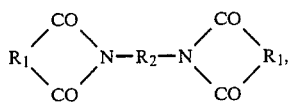

wherein $R_1$ and $R_2$ have the same meanings as described in claim 1 with (B) a diamine represented by the general formula II:

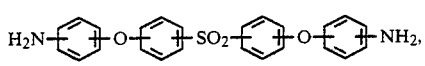

the mole ratio of said bis-imide (A) to said diamine (B) being in the range of 1:0.1 to 1:1.

11. A cross-linked resin according to claim 10, wherein said thermosetting of said polyamino-bis-imide resin is carried out at a temperature in the range of from 170° to 300° C.

12. A copper clad laminated board comprising a fiber reinforced cross-linked polyamino-bis-imide resin of claim 1 bonded to a copper foil.

* * * * *

UNITED STATES PATENT AND TRADEMARK OFFICE
CERTIFICATE OF CORRECTION

PATENT NO. : 4,526,838
DATED : July 2, 1985
INVENTOR(S) : Atsushi Fujioka, Yasuo Miyadera and Tomio Fukuda It is certified that error appears in the above-identified patent and that said Letters Patent is hereby corrected as shown below:

Col. 1, line 41; "affects" should read -- effects --
Col. 2, line 7; "orgnaic" should read -- organic --
Col. 2, line 30; "laminating" should read -- laminated --
Col. 5, line 19; "he" should read -- the --
Col. 7, in TABLE 1, first column, line 6;
  "-diaminodiphenyl(methane" should read
-- -diaminodiphenylmethane --
Col. 8, line 30; "TABLE 5" should read -- TABLE 2 --

Signed and Sealed this

Seventeenth Day of December 1985

[SEAL]

Attest:

DONALD J. QUIGG

Attesting Officer

Commissioner of Patents and Trademarks